US009722111B2

(12) United States Patent
Reese et al.

(10) Patent No.: US 9,722,111 B2
(45) Date of Patent: Aug. 1, 2017

(54) SURFACE PASSIVATION FOR CDTE DEVICES

(71) Applicant: Alliance for Sustainable Energy, LLC, Golden, CO (US)

(72) Inventors: Matthew O. Reese, Golden, CO (US); Craig L. Perkins, Golden, CO (US); James M. Burst, Lakewood, CO (US); Timothy A. Gessert, Conifer, CO (US); Teresa M. Barnes, Evergreen, CO (US); Wyatt K. Metzger, Louisville, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 169 days.

(21) Appl. No.: 14/615,282

(22) Filed: Feb. 5, 2015

(65) Prior Publication Data

US 2015/0221812 A1  Aug. 6, 2015

Related U.S. Application Data (60) Provisional application No. 61/936,563, filed on Feb. 6, 2014, provisional application No. 61/937,159, filed on Feb. 7, 2014, provisional application No. 61/936,574, filed on Feb. 6, 2014, provisional application No. 61/937,178, filed on Feb. 7, 2014.

(51) Int. Cl.
| | |
|---|---|
| *C30B 1/02* | (2006.01) |
| *H01L 31/0296* | (2006.01) |
| *H01L 31/18* | (2006.01) |
| *H01L 21/02* | (2006.01) |
| *H01L 31/073* | (2012.01) |

(52) U.S. Cl.
CPC .... *H01L 31/0296* (2013.01); *H01L 21/02562* (2013.01); *H01L 21/02664* (2013.01); *H01L 31/073* (2013.01); *H01L 31/1828* (2013.01); *Y02E 10/543* (2013.01)

(58) Field of Classification Search
CPC .................................. C30B 1/02; C30B 29/46
See application file for complete search history.

(56) References Cited

U.S. PATENT DOCUMENTS

| | | | | |
|---|---|---|---|---|
| 5,385,651 A | * | 1/1995 | Stickney | .................. C25F 3/12 205/646 |
| 5,454,902 A | * | 10/1995 | Zinck | .................. C23C 16/0227 204/192.35 |
| 5,909,632 A | | 6/1999 | Gessert | |

(Continued)

OTHER PUBLICATIONS

Ma, et al., "Dependence of the Minority-Carrier Lifetime on the Stiochiometry of CdTe Using Time-Resolved Photoluminescence and First-Principles Calculations," Physical Review Letters, vol. 111, Issue 6, Aug. 9, 2013, pp. 067402-1-067402-5.

(Continued)

*Primary Examiner* — Robert M Kunemund
(74) *Attorney, Agent, or Firm* — Suzanne C. Walts (57) ABSTRACT

In one embodiment, a method for surface passivation for CdTe devices is provided. The method includes adjusting a stoichiometry of a surface of a CdTe material layer such that the surface becomes at least one of stoichiometric or Cd-rich; and reconstructing a crystalline lattice at the surface of the CdTe material layer by annealing the adjusted surface.

21 Claims, 5 Drawing Sheets

(56) References Cited

U.S. PATENT DOCUMENTS

| | | | |
|---|---|---|---|
| 5,916,375 A * | 6/1999 | Agui | ............... H01L 31/02246 136/258 |
| 6,281,035 B1 | 8/2001 | Gessert | |
| 6,458,254 B2 | 10/2002 | Gessert | |
| 9,147,793 B2 | 9/2015 | Gessert et al. | |
| 9,419,170 B2 | 8/2016 | Albin et al. | |

OTHER PUBLICATIONS

Kumar, et al., "A CdTe Passivation Process for Long Wavelength Infrared HgCdTe Photo-Detectors", Journal of Electronic Materials, vol. 34, Issue 9, Sep. 2005, pp. 1225-1229.

John, et al., "Photoemission studies of CdTe(100) and the Ag—CdTe(100) interface: Surface structure, growth behavior, Schottky barrier, and surface photovoltage," Physcial Review B, vol. 34, No. 10, Nov. 15, 1986, pp. 6704-6712.

Bosio, et al., "Polycrystalline CdTe thin films for photovoltaic applications," Progress in Crystal Growth and Characterization of Materials, vol. 52, Issue 4, Dec. 2006, pp. 247-279.

Metzger, et al., "Time-resolved photoluminescence studies of CdTe solar cells," Journal of Applied Physics, vol. 94, Issue 5, Sep. 1, 2003, pp. 3549-3555.

Olvera, et al., "Luminescence effects of ion-beam bombardment of CdTe surfaces," Journal of Luminescence, vol. 129, Issue 9, Sep. 2009, pp. 941-944.

Kang, et al., "Surface passivation by sulfur treatment of undoped p-CdTe(100)", Journal of Applied Physics, vol. 88, No. 4, Aug. 15, 2000, pp. 2013-2015.

Strevel, et al., "Improvements in CdTe module reliability and long-term degradation through advances in construction and device innovation", Photovoltaics International, Twenty Second Edition, Fourth Quarter, Dec. 2013, pp. 1-8.

\* cited by examiner

SURFACE PASSIVATION FOR CDTE DEVICES

CROSS REFERENCE TO RELATED APPLICATIONS

This application claims priority to, and the benefit of, U.S. Provisional Application No. 61/936,563, entitled "WET CHEMICAL SURFACE PASSIVATION TREATMENTS FOR CDTE" filed Feb. 6, 2014; U.S. Provisional Application No. 61/937,159, entitled "WET CHEMICAL SURFACE PASSIVATION TREATMENTS FOR CDTE" filed Feb. 7, 2014; U.S. Provisional Application No. 61/936,574, entitled "VACUUM-BASED METHOD FOR PASSIVATING CDTE SURFACES AND INTERFACES" filed Feb. 6, 2014; and U.S. Provisional Application No. 61/937,178, entitled "VACUUM-BASED METHOD FOR PASSIVATING CDTE SURFACES AND INTERFACES" filed Feb. 7, 2014; each of which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Technologies for growing high quality bulk cadmium telluride (CdTe), which may be used for fabricating photovoltaic (PV) devices, have significantly improved in recent years. Reductions in the defect density throughout the bulk CdTe material have led to reduced carrier recombination rates within the material, so that thinner devices may now render a high value of open-circuit voltage ($V_{oc}$) once only achievable in thicker devices. Further, the combination of thinner CdTe materials and reduced bulk recombination rates means that minority carrier lifetimes (MCLs), such as measured by time-resolved photoluminescence (TRPL) measurements, are now long enough for minority carriers to reach the back surface of the CdTe material where back surface contacts are formed. For example, CdTe PV devices today may have CdTe layers on the order of 3-μm or less, and MCLs on the order of 1-2 ns. The advancements have been sufficient for device efficiency to increase from less than 10% to greater than 20%. For those devices with an efficiency greater than 20%, it is very likely that minority carriers are reaching the back contact, where detrimental surface recombination can occur. If they recombine at the back contact, the recombination of minority carriers may add to the $J_o$ (dark current) and reduce the $V_{oc}$, thus reducing the efficiency of the device. Further, to continue to reduce the cost of production modules, the CdTe layer in the device needs to continue to get thinner, and the MCLs need to continue to get longer. As a result, the surface recombination velocity, which formerly contributed to only a negligible fraction of the overall recombination rate in a CdTe device, may soon become the dominant recombination mechanism that limits what open-circuit voltage $V_{oc}$ can be achieved.

As presently known in the art, CdTe material at the back surface is treated to make the stoichiometry of the surface material Tellurium (Te) rich before a contact layer (that includes copper, for example) is deposited onto this Te-rich layer, and often diffused into the bulk of the CdTe material using heat. This is a well-known back surface contact formation process where the contact layer can be chosen to establish an acceptable minority-carrier barrier at the back surface contact. Nonetheless, now that more minority carriers are reaching the back surface contact layers, such treatment processes may no longer provide sufficient surface passivation to adequately address surface recombination. TRPL measurements show that high surface recombination at these back surface contact layers is emerging as a leading challenge to further improving minority carrier lifetimes in CdTe devices. Surface recombination will soon be, if it is not already, one of the primary limiting factors preventing further increases in CdTe PV device efficiency. Accordingly, it would be advantageous to provide new methods for surface passivation that reduce surface recombination in CdTe material.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

In one embodiment, a method for surface passivation for CdTe devices is provided. The method comprises: adjusting a stoichiometry of a surface of a CdTe material layer such that the surface becomes at least one of stoichiometric or Cd-rich; and reconstructing a crystalline lattice at the surface of the CdTe material layer by annealing the adjusted surface.

In another embodiment, a photovoltaic (PV) device is provided. The device comprises: a first layer comprising a CdTe layer, the CdTe layer including a first surface that is at least one of stoichiometric or Cd-rich; and a back surface contact layer grown on the first surface.

In still another embodiment, another photovoltaic (PV) device is provided. The device comprises: a first layer comprising a CdTe layer, the CdTe layer including a first surface that is Cd-rich; and a second layer grown on the first surface.

DRAWINGS

Exemplary embodiments are illustrated in the drawings. It is intended that the embodiments and figures disclosed herein are to be considered illustrative rather than limiting.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the present disclosure introduce passivation methods that reduce (as compared to the related art) minority carrier surface recombination velocities in CdTe devices by adjusting the stoichiometry of a CdTe surface during fabrication so that the stoichiometry of the surface will be either stoichiometric or Cadmium (Cd) rich rather than Tellurium (Te) rich. A stoichiometric surface has a 1:1 ratio of Cd to Te. For a Cd-rich surface, the number of Cd atoms exceeds the number of Te atoms. As explained in detail below, the example embodiments disclosed herein introduce wet and dry passivation treatment processes, and processes comprising combinations thereof, each of which may be followed by optional annealing reconstruction. Derived from investigations of various CdTe surface treatment processes, the present disclosure introduces solutions that are premised on the inventors' findings that a stoichiometric to Cd-rich defect chemistry will have fewer deep defects with low formation energy than a Te-rich defect chemistry. In this model, the Te vacancy ($V_{Te}$) becomes a shallow donor, Te antisites ($Te_{Cd}$) and Te interstitials ($Te_i$) become the dominant mid-gap deep levels, and the Cd vacancy ($V_{Cd}$) becomes a deeper acceptor (~0.4 eV above the valence band maximum). This conclusion is supported with experimentally grown off-stoichiometric samples that exhibited higher recombination in Te-rich samples than Cd-rich ones.

Figure 1:
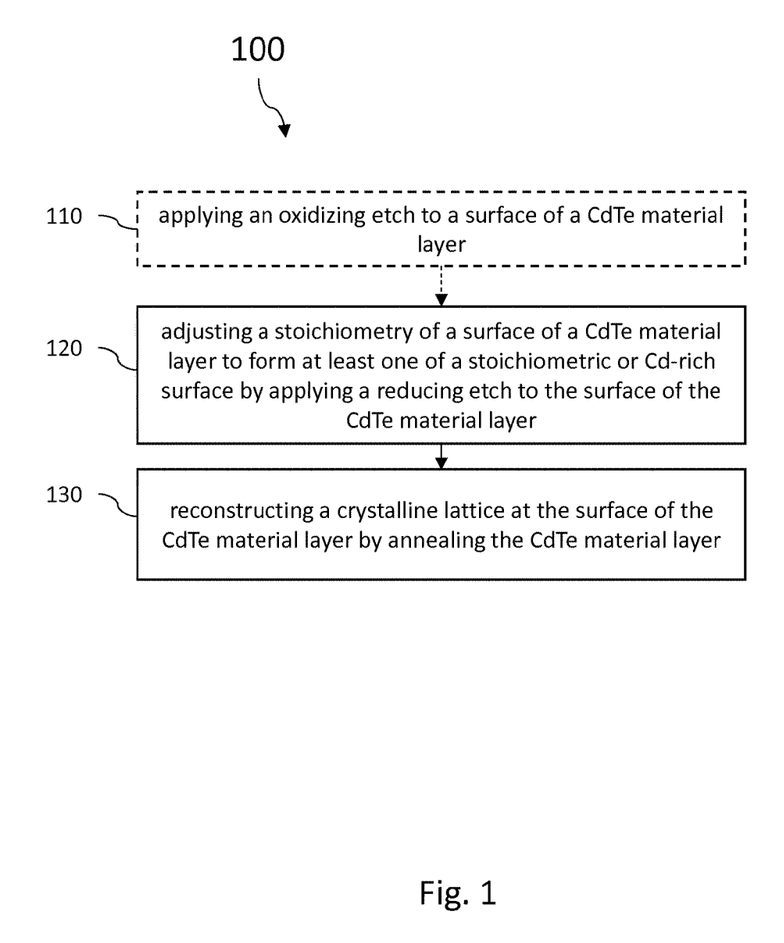
FIG. 1 is a flow chart illustrating a surface passivation method for CdTe of one embodiment of the present disclosure.

FIG. 1 is a flow chart illustrating a wet etch surface passivation method 100 for CdTe of one embodiment of the present disclosure. The wet etches described herein may generally be classified as either oxidizing agents or reducing agents. It was found by the inventors that application of oxidizing agents to a CdTe surface leaves a Te-rich layer on the CdTe surface, and if allowed sufficient etching time could produce what is essentially an elemental Te layer on the CdTe surface. In contrast, reducing agents applied to CdTe were found to be less aggressive, but more importantly left a Cd-rich layer that tended to be closer to stoichiometric.

The process may begin at 110 with applying an oxidizing etch to a surface of a CdTe material layer. As the term is used herein, a CdTe material layer is intended to refer to layers of both CdTe and CdTe alloys. The surface of the CdTe material layer can sometimes be damaged (for example, due to mechanical polishing), and include impurities. Application of the oxidizing etch serves to normalize the surface and remove residual $CdCl_2$ or other impurities that might interfere with formation of subsequent layers, such as a back contact for a CdTe PV device. In addition, the oxidizing etch strips away a portion of the Cd from the CdTe material layer. Oxidizing agents used in this step may include agents such as, but not limited to, Bromine/Methanol (Br/MeOH); nitric/phosphoric acid (NP); mixtures of acetic, nitric and sulfuric acid; ferric chloride; mixtures of nitric acid and potassium dichromate; mixtures of nitric acid, potassium dichromate and $CuNO_3$. Such wet chemical treatments are highly acidic or otherwise oxidizing solutions that remove any native cadmium tellurate oxide or other impurities from the surface of a CdTe material layer, and leave the surface Te-rich. The resulting surface is well prepared for applying Cu-containing contact layers, but not optimized with respect to addressing or optimizing surface recombination.

Accordingly, the process proceeds to 120 by adjusting a stoichiometry of the surface to form a stoichiometric to Cd-rich surface by applying a reducing etch to the surface of the CdTe material layer. That is, the stoichiometry of the surface is adjusted to be either stoichiometric or Cd-rich. The reducing etch serves to bring the stoichiometry of the surface into the range of stoichiometric to Cd-rich by removing excess Tellurium. In some implementations, the CdTe material layer may have been left with excess Tellurium from the oxidizing etch performed at 110. In other embodiments, the oxidizing etch at 110 may have been omitted, optionally in favor of another technique, but the stoichiometry of the resulting surface is still Te-rich. Reducing agents used to perform the reducing etch may include, but are not limited to, a basic salt, an alkali or alkaline material, hydrazine, potassium hydroxide (KOH), Sodium hydroxide (NaOH), or mixtures of NaOH and Sodium dithionite ($Na_2S_2O_4$). More specifically, as the term is used herein, a reducing agent is a solution that acts to reduce the oxidizing state of Cd within a CdTe lattice. For example, Cd prefers an oxidation state of +2. An etching agent that reduces the oxidation state of Cd within the CdTe lattice (for example, to zero) would be a reducing agent. The result of such adjusting of the stoichiometry of the CdTe surface includes increased TRPL measured minority carrier lifetimes over Te-rich materials, indicating a reduction of surface recombination velocities in CdTe surfaces treated with the reducing etch. In fact, application of reducing treatments were found to increase the near-surface lifetime of minority carriers in CdTe enough, by reducing surface recombination, that TRPL measurements instead began to reveal the true bulk minority carrier lifetimes in the CdTe material.

The inventors have found that the reducing etch can be applied over a wide range of temperatures and times that envelopes temperatures and times that would be suitable for industrial and lab scale processing. For example, reducing etches performed in the range of 5 seconds to 8 minutes and at the relatively low temperatures of 20 C to 65 C have been shown to produce the CdTe surfaces in the desired range from stoichiometric to Cd-rich. Further, the etching may be performed either in air or other inert environments without any noticeable difference in results.

The method then proceeds to 130 with reconstructing a crystalline lattice at the surface of the CdTe material layer by annealing the CdTe material layer. Annealing the stoichiometric to Cd-rich surface can serve two purposes. First, the thermal process may thermally remove any remaining loosely bound Te from the surface. For example, if the surface after etching still remains Te-rich, a thermal anneal may be used to further adjust the stoichiometry by removing such Te. Second, annealing also reconstructs the CdTe crystalline lattice in the surface of the treated CdTe material. One result of the aforementioned etching processes at 110 and 120 is that the CdTe crystalline lattice will develop structural defects of the type that can facilitate recombination. These defects, if left untreated, would negate at least some of the benefit of the adjustments to stoichiometry provided by the reducing etch. Annealing after the reducing etch provides energy that allows the CdTe crystalline lattice damaged by the etching to reorganize and re-establish periodicity. The degree of reconstruction provided is a function of both time and temperature used. For example, in one embodiment, annealing at block 130 may be performed at a temperature within the range of 150 C to 300 C. A convenient annealing temperature within this range can be selected and then the duration where the heat is applied may be adjusted as necessary to achieve the desired degree of lattice ordering given the size of the material. The annealing may be accomplished by any suitable method. Further, in some implementations, the temperature profile of the applied heat may be tailored to accommodate industrial fabrication processes or for other reasons. For example, the temperature profile of the applied annealing heat may comprise a spike that rapidly brings the material to a target temperature, followed by a cool down period as the material returns to an ambient temperature. The resulting surface from method 100 is ready for subsequent fabrication steps.

Figure 2:
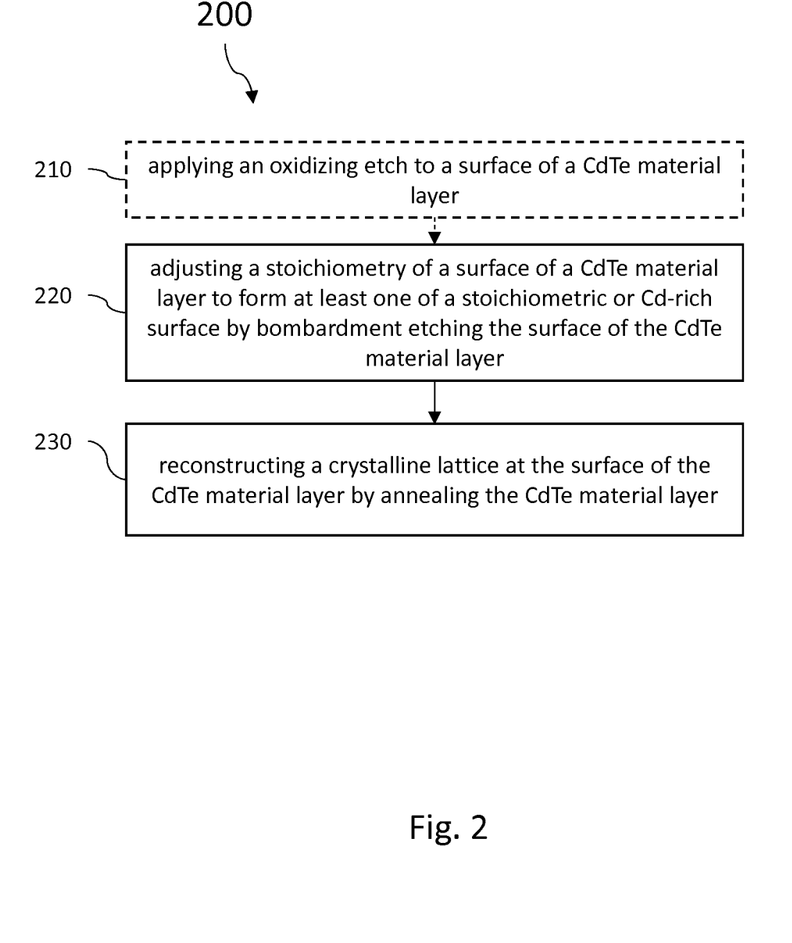
FIG. 2 is a flow chart illustrating a surface passivation method for CdTe of another embodiment of the present disclosure.

FIG. 2 is a flow chart illustrating a dry etch surface passivation method 200 for CdTe of one embodiment of the present disclosure. As with the method of FIG. 1, the method 200 may begin at 210 with optionally applying an oxidizing etch to a surface of a CdTe material layer to normalize a potentially damaged surface (for example, due to mechanical polishing), and remove impurities. Such oxidizing etches, as mentioned above, leave the surface Te-rich. The resulting surface is well prepared for applying standard, Cu-containing contacting layers, but not optimized with respect to addressing or optimizing surface recombination.

The method proceeds to 220 with adjusting a stoichiometry of a surface of a CdTe material layer to form a stoichiometric to Cd-rich surface by bombardment etching the surface of the CdTe material layer. That is, the stoichiometry of the surface is adjusted to be either stoichiometric or Cd-rich.

In one embodiment, bombardment etching comprises a sputter etching. Sputtering, as the term is typically used in industry, may refer to a process for depositing material onto a substrate, or a process for removing material (i.e. etching). For example, in a sputtering deposition process, a sputter gun is aimed at a target and bombards the target with a projectile (chemically inert argon, for example) to remove material from the target. The material ejected from the target impacts the substrate, forming a deposited layer of the material on the substrate. In contrast, sputter etching typically involves the removal of material from a substrate by aiming the ion source at the substrate under high vacuum conditions and bombarding the substrate with a projectile (argon, for example). Sputter etching is the sputtering processes used in the method of FIG. 2. As mentioned above, the oxidizing etch at 210 will leave the surface Te-rich. In one embodiment, sputtering etching at 220 can be used to remove the excess Te, thereby adjusting the stoichiometry.

In another embodiment, bombardment etching comprises a plasma etching. For example, in some embodiments, bombardment etching may utilize a chemically-active plasma or other vacuum compatible chemical process. Here, gas phase projectiles are directed at the surface with a relatively small amount of energy. They attach to the surface material, pulling some away as they recoil. The surface may be heated, which will further facilitate the etching. Bombardment etching may be performed in an environment that either simultaneously or sequentially includes oxidizing or reducing environments. In some implementations, the plasma etch may be performed using a hydrogen plasma or thermally cracked hydrogen. Such a process should selectively remove $H_2Te$ from the material layer, leaving a Cd-rich surface. The plasma may also be performed using Argon, or other chemically active plasma species that would render a stoichiometric to Cd rich surface. Substrate temperatures during plasma or sputter etching may be elevated. For example, method 200, when performed as part of a commercial process, may be performed immediately after a $CdCl_2$ process at temperatures from 400-450° C.

In some embodiments, bombardment etching the surface of the CdTe material layer at 220 may be performed without first applying an oxidizing etch at 210. In that case, the bombardment etching further acts to remove impurities from the surface.

Bombardment etching will remove impurities from the surface of the CdTe material, but can leave a very disordered surface, and may cause subsurface damage. Therefore method 200 can proceed to 230 with reconstructing a crystalline lattice at the surface of the CdTe material layer by annealing the CdTe material layer. Thermal annealing after the etching provides energy that allows the CdTe crystalline lattice damaged by the etching to reorganize and re-establish periodicity. The degree of reconstruction provided is a function of both time and temperature used. For example, in one embodiment, annealing at block 230 may be performed at a temperature within the range of 150 C to 300 C. A convenient annealing temperature within this range can be selected and then the duration where the heat is applied may be adjusted as necessary to achieve the desired degree of lattice ordering and given the size of the material. The annealing may be accomplished by any suitable method. Further, in some implementations, the temperature profile of the applied heat may be tailored to accommodate industrial fabrication processes or for other reasons. For example, the temperature profile of the applied annealing heat may comprise a spike that rapidly brings the material to a target temperature, followed by a cool down period as the material returns to an ambient temperature. The resulting surface from method 200 is ready for subsequent fabrication steps.

Either of the methods 100 or 200 may be followed by an optional treatment with UV/Ozone. For example, in one embodiment, UV/Ozone is applied for 600 s at room temperature using air as the feed gas. Results show that a CdTe (100) surface processed using the passivation methods has a $\tau_1$ minority carrier lifetime that remains constant despite exposure to air and subsequent oxidation as observed with X-ray photoelectron spectroscopy (XPS). By using a commercial UV/ozone surface cleaning system to heavily oxidize a passivated surface and then using TRPL, to show that $\tau_1$ is unchanged relative to the clean passivated surface produced at the end of methods 100 and 200, it was demonstrated that: 1) crystallinity of the near surface region is at least one factor responsible for passivation of CdTe via the process described herein, and 2) the interface of CdTe with the resulting oxide $CdTeO_3$ continues to exhibit a low recombination.

Figure 3A:
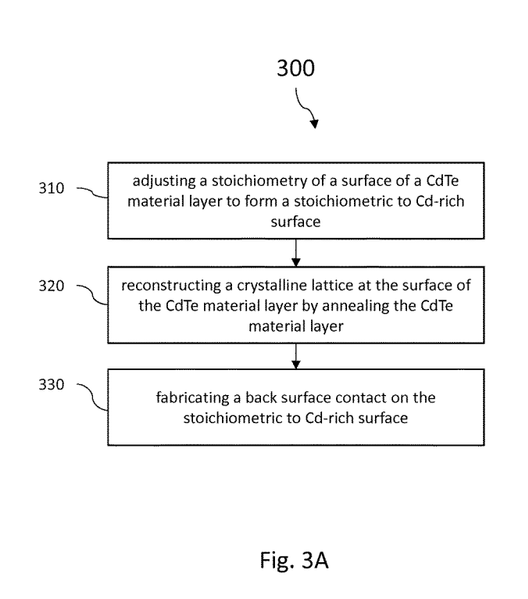
FIGS. 3A and 3B illustrate one embodiment of a method for CdTe surface passivation and a corresponding embodiment of a CdTe PV device resulting from the method.
Figure 3B:
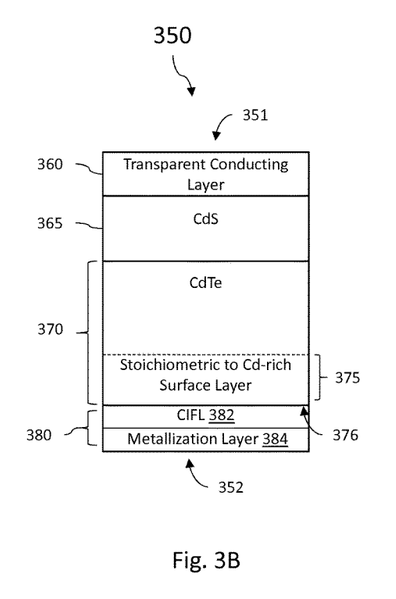

FIGS. 3A and 3B illustrate one embodiment of a method 300 for CdTe surface passivation and a corresponding embodiment of a CdTe PV device 350 resulting from method 300. In alternate embodiments, method 300 may be implemented based on corresponding steps described with respect to the methods of FIG. 1 and FIG. 2. That is, the descriptions, options and alternatives discussed above for applying an oxidizing etch, adjusting stoichiometry and annealing are applicable to method 300. In one implementation, method 300 may use a substrate comprising a transparent conducting layer (TCL) 360 which may have been be grown on a glass substrate (not shown), a CdS layer 365

(grown on the TCL 360) and a CdTe layer 370 (grown on the CdS layer 365). In alternate embodiments, TCL 360 may comprise, for example, a transparent conducting oxide (TCO) layer or a layer of metal nanowires. Method 300 provides a process that may be used in conjunction with applying an ohmic back surface contact layer 380 for CdTe PV device 350. The method begins at 310 with adjusting a stoichiometry of a surface of a CdTe material layer to form a stoichiometric to Cd-rich surface. At 310, the CdTe layer 370 is etched at surface 376 to form a layer 375 within CdTe layer 370 that is stoichiometric to Cd-rich. That is, the stoichiometry of the surface 376 is adjusted to be either stoichiometric or Cd-rich. This adjustment may be performed using a reducing etch such as described with respect to FIG. 1, or using a bombardment etch such as described with respect to FIG. 2. Adjusting the stoichiometry of surface 376 will typically leave layer 375 in a disordered state, the crystalline structure of the CdTe material in layer 375 being replete with defects. Method 300 therefor proceeds to 320 with reconstructing a crystalline lattice at the surface of the CdTe material layer by annealing the CdTe material layer. Annealing allows the CdTe crystalline lattice damaged by the etching to reorganize and re-establish periodicity. The CdTe layer 370 may be allowed to cool, and the resulting layer 375 at surface 376 will be both well-ordered in structure and stoichiometric to Cd-rich. The method may then proceed to 330 with fabricating a back-surface contact on the stoichiometric to Cd-rich surface. Fabrication of the back-surface contact 380 onto surface 376 may further comprise depositing additional material layers such as, but not limited to a contact-interface layer (CIFL) 382 and a metallization layer 384. For example, the resulting back-surface contact 380 may comprise, but is not limited to, a CIFL 382 of Cu doped ZnTe, CuTe, or other materials (such as a Cu-free material), and metallization layer 384 of copper, gold, titanium, aluminum, or other conducting materials or alloys. The CIFL 382 should have the attributes of proper band alignment with the material layer being contacted. For example, where CdTe layer 370 is p-type CdTe, the CIFL 382 should facilitate valence band alignment with the p-type CdTe layer. Where CdTe layer 370 is n-type CdTe, the CIFL 382 should facilitate conduction band alignment with the n-CdTe layer. In both cases of p-type and n-type CdTe, the CIFL 382 should also embody sufficient p-type or n-type doping to facilitate low-resistance transport of majority carriers into the outer metallization layer 384.

As shown in FIG. 3B, CdTe PV device 350 has a front surface 351 and a back surface 352. In operation, light enters CdTe PV device 350 at front surface 351, penetrates through the transparent conducting layer 360, and separates into electron-hole pairs. In this form, the electrons and holes define carriers within the semiconductor CdS and CdTe layers 365, 370, that can contribute to the open circuit-voltage ($V_{oc}$) and the short-circuit current ($J_{sc}$) developed between TCO 360 and back-surface contact 380. Recombination of electron-hole pairs within device 350 is therefore detrimental to the device's open circuit-voltage ($V_{oc}$) and short-circuit current ($J_{sc}$). For devices where the thickness of the CdTe layer 370 may be on the order of 3 µm or less, and the MCLs of minority carriers within CdTe layer 370 may be on the order of 2 ns or longer, minority carriers have an increasing likelihood to diffuse to surface 376. This likelihood can be estimated using the following equation of minority carrier diffusion length (L) if the minority carrier mobility in the material (µ) and the MCL (τ) are known:

$$L = \sqrt{\frac{kT}{q}\mu\tau}$$

In this equation, k is the Boltzmann constant, T is the temperature in Kelvins, and q is the electronic charge on the electron. This equation would predict that, at room temperature, if the minority carrier mobility were 100 cm$^2$V$^{-1}$s$^{-1}$, and the MCL in the bulk of the CdTe were 5 ns, the minority carrier diffusion length for the majority of the carriers would be longer than 1 µm. As mentioned previously, the rate of recombination at the CdTe surfaces (referred to as the Surface Recombination Velocity) is emerging as the dominant recombination mechanism in CdTe PV devices that limits what open-circuit voltage can be achieved. Having the CdTe layer 370 comprise a stoichiometric to Cd-rich layer 375 with a well ordered crystalline CdTe lattice at the surface 376 interface with back surface contact 380 directly addresses this recombination mechanism by providing a CdTe PV device with reduced surface recombination velocity characteristics as compared to previously available CdTe PV devices.

Figure 3C:
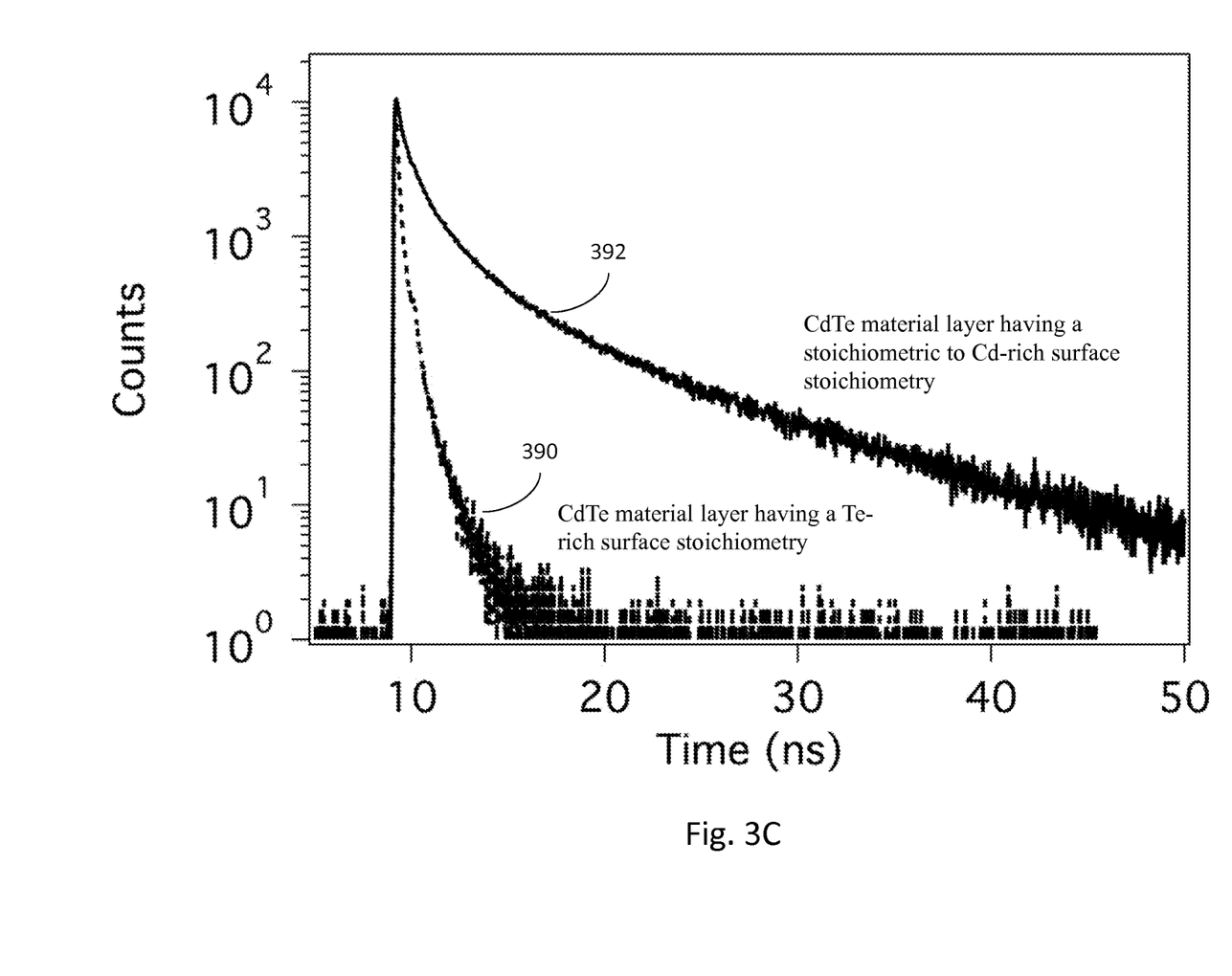
FIG. 3C is a graph comparing measured photoluminescent intensity as a function of time for both a CdTe material layer having a Te-rich surface stoichiometry and a CdTe material layer having a stoichiometric to Cd-rich surface stoichiometry.

FIG. 3C is a graph comparing measured photoluminescent intensity (in counts) as a function of time for both a CdTe material layer having a Te-rich surface stoichiometry (shown at 390) and a CdTe material layer having a stoichiometric to Cd-rich surface stoichiometry (shown at 392). It has been observed that minority carrier lifetime can be related to the surface recombination velocity using the equation:

$$\tau_1 = 1/(\alpha S)$$

where $\tau_1$ is the shorter fitted lifetime in a two exponential fit of a one photon excitation (1 PE)-time-resolved photoluminescence (TRPL) curve, α is the attenuation coefficient, and S is the surface recombination velocity. The slower decay in photoluminescence (PL) intensity of the stoichiometric to Cd-rich surface curve 392 as compared to the Te-rich surface curve 390 supports the inventors' conclusions that minority carriers enjoy significantly longer MCLs in the material with a stoichiometric to Cd-rich surface than in the material with a Te-rich surface. Lower surface recombination velocities can be realized in CdTe devices where the passivation techniques described herein have been applied. For example, testing has found surface recombination velocities in the range of 10^5-10^7 cm/s for single crystal CdTe sample wafers not treated with the passivation methods described in this disclosure. Substantially similar single crystal CdTe sample wafers treated as described according to the methods of FIGS. 1 and 3 can expect surface recombination velocities less than 5×10^4 cm/s.

Figure 4A:
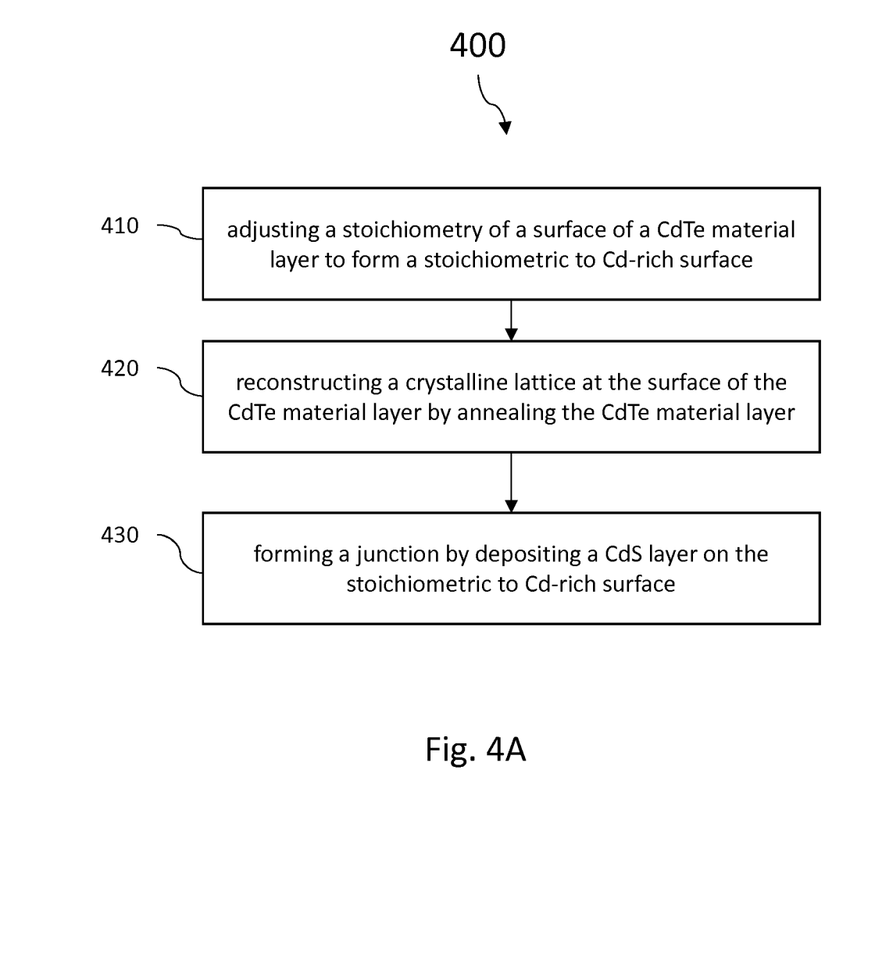
FIGS. 4A and 4B illustrate one embodiment of a method for CdTe surface passivation and a corresponding embodiment of a CdTe PV device resulting from the method.
Figure 4B:
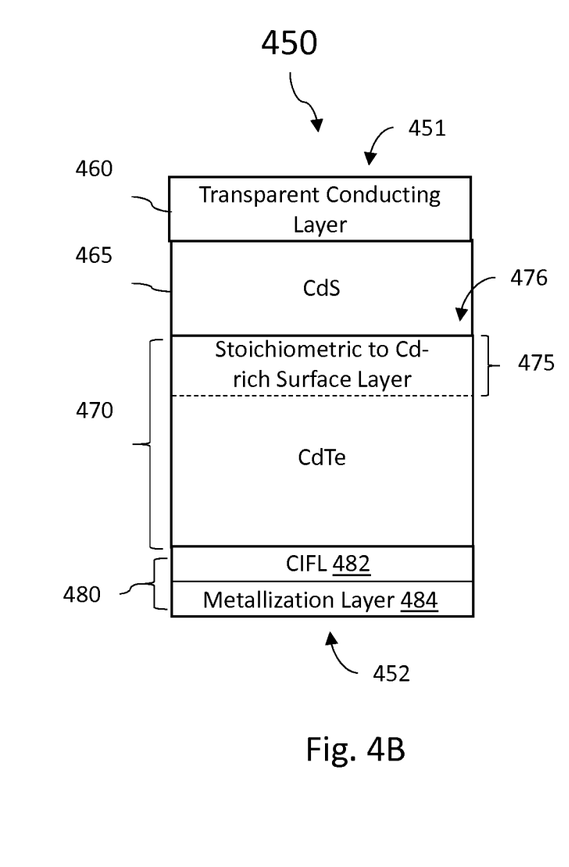

FIGS. 4A and 4B illustrate another embodiment of a method 400 for CdTe surface passivation and a corresponding embodiment of a device CdTe PV device 450 which may result from method 400. In alternate embodiments, method 400 may be implemented based on corresponding steps described with respect to the methods of FIG. 1 and FIG. 2. That is, the descriptions, options and alternatives discussed above for applying an oxidizing etch, adjusting stoichiometry and annealing are applicable to method 400. Method 400 may be used in conjunction with an alternative fabrication process for CdTe PV devices where the device is fabricated starting from the back surface contact layers 480 up toward the transparent conducting layer (TCL) 460. For example, in a heterojunction, the CdTe surface that may benefit from passivation is the interface between the CdTe layer and a heterocouple layer (for example a CdS layer). In the case of a homojunction, the front contact side of the exposed CdTe surface, or even the junction and then the front contact side may similarly benefit.

In one implementation, method 400 may use a substrate already comprising a Back Surface Contact 480 (which may comprise CIFL 482 and metallization layer 484) and a CdTe layer 470 grown on the Back Surface Contact 480. The deposited CdTe layer 470 will have a surface (shown at 476) upon which CdS layer 465 will be grown. From this interface between CdTe layer 470 and CdS layer 465, a p-n junction will eventually form. Surface recombination at surface 476 is detrimental to the efficiency of CdTe PV device 450 for the same reasons described above, not least of which is that it lowers the $V_{oc}$ that can be produced by device 450. Method 400 provides a process for providing passivation at the CdTe/CdS interface of a CdTe PV device. The method begins at 410 with adjusting a stoichiometry of a surface of a CdTe material layer to form a stoichiometric to Cd-rich surface. At 410, the CdTe layer 470 is etched at surface 476 to form a layer 475 within CdTe layer 470 that is stoichiometric to Cd-rich. That is, the stoichiometry of the surface 476 is adjusted to be either stoichiometric or Cd-rich. This adjustment may be performed using a reducing etch such as described with respect to FIG. 1, or using a bombardment etch such as described with respect to FIG. 2. Adjusting the stoichiometry of surface 476 will leave layer 475 in a disordered state, the crystalline structure of the CdTe material in layer 475 being replete with defects. Method 400 therefor proceeds to 420 with reconstructing a crystalline lattice at the surface of the CdTe material layer by annealing the CdTe material layer. Thermal annealing allows the CdTe crystalline lattice damaged by the etching to reorganize and re-establish periodicity. The CdTe layer 470 may be allowed to cool, and the resulting layer 475 at surface 476 is now both well-ordered and stoichiometric to Cd-rich. The method may then proceed to 430 with forming a junction by depositing a CdS layer on the stoichiometric to Cd-rich surface. In other embodiments, a material other than CdS may be used to form a heterocouple layer, or a second CdTe layer may be deposited to form a homojunction. TCL layer 460 may then be applied using techniques known to those of skill in the art. In alternate embodiments, TCL 460 may comprise, for example, a transparent conducting oxide (TCO) layer or a layer of metal nanowires.

As shown in FIG. 4B, CdTe PV device 450 has a front surface 451 and a back surface 452. In operation, light enters CdTe PV device 450 at front surface 351, penetrates through the transparent conducting layer 460, and separates into an electron-hole pairs. In this form, the electrons and holes define carriers that can contribute to the open circuit-voltage ($V_{oc}$) and short-circuit current ($J_{sc}$) developed between TCL 460 and back surface contact 480. Having the CdTe layer 470 comprise a stoichiometric to Cd-rich layer 475 with a well ordered crystalline CdTe lattice at the interface with CdS layer 465 defined by surface 476. For the reasons previously discussed above, stoichiometric to Cd-rich layer 475 addresses potential recombination mechanisms at surface 476, providing a CdTe PV device with a lower Surface Recombination Velocity as compared to previously available CdTe PV devices.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true scope.

What is claimed is:

1. A method for surface passivation, the method comprising:
   adjusting a stoichiometry of a surface of a CdTe material layer such that the surface becomes Cd-rich; and
   reconstructing a crystalline lattice at the surface of the CdTe material layer by annealing the adjusted surface.

2. The method of claim 1, further comprising:
   applying an oxidizing etch to the surface of the CdTe material layer prior to adjusting the stoichiometry of the surface.

3. The method of claim 2, wherein applying the oxidizing etch comprises applying an oxidizing agent including at least one of Bromine/Methanol (Br/MeOH); nitric/phosphoric acid (NP); mixtures of acetic, nitric and sulfuric acid; ferric chloride; mixtures of nitric acid and potassium dichromate; or mixtures of nitric acid, potassium dichromate and $CuNO_3$.

4. The method of claim 1, wherein adjusting the stoichiometry of the surface of the CdTe material layer comprises applying a reducing etch to the surface of the CdTe material layer.

5. The method of claim 4, wherein applying the reducing etch comprises applying a reducing agent including at least one of a basic salt, an alkali or alkaline material, hydrazine, potassium hydroxide (KOH), sodium hydroxide (NaOH), or mixtures of NaOH and sodium dithionite ($Na_2S_2O_4$).

6. The method of claim 1, wherein adjusting the stoichiometry of the surface of the CdTe material layer comprises bombardment etching the surface of the CdTe material layer.

7. The method of claim 6, wherein the bombardment etching comprises either sputter etching or plasma etching.

8. The method of claim 1, further comprising:
   forming a contact layer on the adjusted surface.

9. The method of claim 8, wherein forming the contact layer on the adjusted surface comprises:
   forming a contact interface layer on the adjusted surface; and
   forming a metallization layer on the contact interface layer;
   wherein the contact interface layer has band alignment with a material of the CdTe material layer.

10. The method of claim 1, further comprising:
    forming a heterocouple layer on the adjusted surface.

11. The method of claim 1, wherein the stoichiometry of the adjusted surface is further adjusted by the annealing of the adjusted surface.

12. A method for surface passivation, the method comprising:
    adjusting a stoichiometry of a surface of a CdTe material layer such that the surface becomes at least one of stoichiometric or Cd-rich; and
    reconstructing a crystalline lattice at the surface of the CdTe material layer by annealing the adjusted surface,
    wherein adjusting the stoichiometry of the surface of the CdTe material layer comprises applying a reducing etch to the surface of the CdTe material layer.

13. The method of claim 12, further comprising:
    applying an oxidizing etch to the surface of the CdTe material layer prior to adjusting the stoichiometry of the surface.

14. The method of claim 13, wherein applying the oxidizing etch comprises applying an oxidizing agent including at least one of Bromine/Methanol (Br/MeOH);

nitric/phosphoric acid (NP); mixtures of acetic, nitric and sulfuric acid; ferric chloride; mixtures of nitric acid and potassium dichromate; or mixtures of nitric acid, potassium dichromate and $CuNO_3$.

15. The method of claim 12, wherein applying the reducing etch comprises applying a reducing agent including at least one of a basic salt, an alkali or alkaline material, hydrazine, potassium hydroxide (KOH), sodium hydroxide (NaOH), or mixtures of NaOH and sodium dithionite ($Na_2S_2O_4$).

16. The method of claim 12, wherein adjusting the stoichiometry of the surface of the CdTe material layer comprises adjusting the stoichiometry of the surface of the CdTe material layer to stoichiometric.

17. The method of claim 12, wherein adjusting the stoichiometry of the surface of the CdTe material layer comprises adjusting the stoichiometry of the surface of the CdTe material layer to Cd-rich.

18. The method of claim 12, further comprising:
forming a contact layer on the adjusted surface.

19. The method of claim 18, wherein forming the contact layer on the adjusted surface comprises:
forming a contact interface layer on the adjusted surface; and
forming a metallization layer on the contact interface layer;
wherein the contact interface layer has band alignment with a material of the CdTe material layer.

20. The method of claim 12, further comprising:
forming a heterocouple layer on the adjusted surface.

21. The method of claim 12, wherein the stoichiometry of the adjusted surface is further adjusted by the annealing of the adjusted surface.

* * * * *